(12) United States Patent
Sheppard et al.

(10) Patent No.: US 7,855,401 B2
(45) Date of Patent: *Dec. 21, 2010

(54) PASSIVATION OF WIDE BAND-GAP BASED SEMICONDUCTOR DEVICES WITH HYDROGEN-FREE SPUTTERED NITRIDES

(75) Inventors: Scott T. Sheppard, Chapel Hill, NC (US); Richard P. Smith, Carrboro, NC (US); Zoltan Ring, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 636 days.

This patent is subject to a terminal disclaimer.

(21) Appl. No.: 11/845,805

(22) Filed: Aug. 28, 2007

(65) Prior Publication Data

US 2008/0035934 A1 Feb. 14, 2008

Related U.S. Application Data

(63) Continuation-in-part of application No. 11/169,378, filed on Jun. 29, 2005, now Pat. No. 7,525,122.

(51) Int. Cl.
*H01L 29/66* (2006.01)

(52) U.S. Cl. .............................. 257/194; 257/E29.253; 257/192

(58) Field of Classification Search ................. 257/194, 257/E29.253
See application file for complete search history.

(56) References Cited

U.S. PATENT DOCUMENTS

| | | |
|---|---|---|
| 3,895,127 A | 7/1975 | Comizzoli |
| 3,982,267 A | 9/1976 | Henry |
| 4,551,353 A | 11/1985 | Hower et al. |
| 4,717,641 A | 1/1988 | Belmont et al. |
| 4,799,100 A | 1/1989 | Blanchard et al. |
| 5,332,697 A | 7/1994 | Smith et al. |
| 5,430,324 A | 7/1995 | Bencuya |
| 5,466,617 A | 11/1995 | Shannon |
| 5,605,852 A | 2/1997 | Bencuya |
| 5,650,638 A | 7/1997 | Harris et al. |
| 5,776,837 A | 7/1998 | Palmour |
| 5,972,801 A | 10/1999 | Lipkin et al. |
| 6,001,716 A | 12/1999 | Liao |

(Continued)

FOREIGN PATENT DOCUMENTS

EP 1 149 934 A2 10/2001

(Continued)

OTHER PUBLICATIONS

ROC (Taiwan) Search Report of foreign counterpart application No. 095123557; date of completion Jan. 15, 2009; 1 pg.

(Continued)

*Primary Examiner*—David A Zarneke
*Assistant Examiner*—Igwe U Anya
(74) *Attorney, Agent, or Firm*—Withrow & Terranova, P.L.L.C.

(57) ABSTRACT

An improved field effect transistor formed in the Group III nitride material system includes a two part structure in which a chemical vapor deposited passivation layer of silicon nitride encapsulates a previously sputtered-deposited layer of silicon nitride. The sputtered layer provides some of the benefits of passivation and the chemical vapor deposited layer provides an excellent environmental barrier.

31 Claims, 4 Drawing Sheets

U.S. PATENT DOCUMENTS

| | | |
|---|---|---|
| 6,246,076 B1 | 6/2001 | Lipkin et al. |
| 6,396,090 B1 | 5/2002 | Hsu et al. |
| 6,426,542 B1 | 7/2002 | Tan |
| 6,429,518 B1 | 8/2002 | Endo |
| 6,437,371 B2 | 8/2002 | Lipkin et al. |
| 6,528,373 B2 | 3/2003 | Lipkin et al. |
| 6,586,781 B2 | 7/2003 | Wu et al. |
| 6,610,366 B2 | 8/2003 | Lipkin |
| 6,673,662 B2 | 1/2004 | Singh |
| 6,767,843 B2 | 7/2004 | Lipkin et al. |
| 6,797,586 B2 | 9/2004 | Dev |
| 6,825,501 B2 | 11/2004 | Edmond et al. |
| 6,849,882 B2 | 2/2005 | Chavarkar et al. |
| 6,939,756 B1 | 9/2005 | Chung et al. |
| 7,598,576 B2 | 10/2009 | Ward, III et al. |
| 2001/0009788 A1 | 7/2001 | Lipkin et al. |
| 2001/0023964 A1 | 9/2001 | Wu et al. |
| 2001/0028100 A1 | 10/2001 | Schmitz et al. |
| 2001/0050369 A1 | 12/2001 | Zeng et al. |
| 2002/0052076 A1 | 5/2002 | Khan et al. |
| 2002/0121641 A1 | 9/2002 | Alok et al. |
| 2003/0020092 A1* | 1/2003 | Parikh et al. .................. 257/192 |
| 2003/0025121 A1 | 2/2003 | Edmond et al. |
| 2003/0160274 A1 | 8/2003 | Das et al. |
| 2003/0201453 A2 | 10/2003 | Edmond |
| 2004/0099888 A1 | 5/2004 | Saptharishi |
| 2004/0099928 A1 | 5/2004 | Nunan et al. |
| 2004/0118202 A1 | 6/2004 | Iwaki et al. |
| 2004/0159865 A1 | 8/2004 | Allen et al. |
| 2004/0160118 A1 | 8/2004 | Knollenberg et al. |
| 2005/0019971 A1 | 1/2005 | Slater, Jr. et al. |
| 2005/0097941 A1 | 5/2005 | Sandvik et al. |
| 2005/0156284 A1 | 7/2005 | Schmidt |
| 2005/0170574 A1 | 8/2005 | Sheppard et al. |
| 2005/0193800 A1 | 9/2005 | DeBoer et al. |
| 2005/0212075 A1 | 9/2005 | Neidig |
| 2005/0221628 A1 | 10/2005 | Tanaka et al. |
| 2005/0258431 A1 | 11/2005 | Smith et al. |
| 2005/0274980 A1* | 12/2005 | Miyoshi ..................... 257/192 |
| 2005/0285233 A1 | 12/2005 | Huang et al. |
| 2006/0006414 A1* | 1/2006 | Germain et al. ............. 257/192 |
| 2006/0006415 A1 | 1/2006 | Wu et al. |
| 2006/0043379 A1 | 3/2006 | Zhang et al. |
| 2006/0043437 A1 | 3/2006 | Mouli |
| 2006/0118892 A1 | 6/2006 | Wu et al. |
| 2006/0145190 A1 | 7/2006 | Salzman et al. |
| 2006/0157733 A1 | 7/2006 | Lucovsky et al. |
| 2006/0191474 A1* | 8/2006 | Chen et al. .................. 117/104 |
| 2007/0001174 A1 | 1/2007 | Ring et al. |
| 2007/0001176 A1 | 1/2007 | Ward et al. |
| 2007/0018272 A1 | 1/2007 | Henning et al. |
| 2007/0164321 A1 | 7/2007 | Sheppard et al. |
| 2007/0164322 A1 | 7/2007 | Smith et al. |
| 2008/0035934 A1 | 2/2008 | Sheppard et al. |
| 2009/0215280 A1 | 8/2009 | Ring et al. |

FOREIGN PATENT DOCUMENTS

| | | |
|---|---|---|
| EP | 1798762 A2 | 6/2007 |
| TW | 471049 | 1/2002 |
| TW | 474024 | 1/2002 |
| TW | 579600 | 3/2004 |
| WO | 0113436 | 2/2001 |
| WO | 0249114 | 6/2002 |
| WO | WO 2005/076365 | 8/2005 |
| WO | 2005/114743 A2 | 12/2005 |
| WO | 2007/064689 A1 | 6/2007 |

OTHER PUBLICATIONS

Lipkin et al, "Improved Oxidation Procedures for Reduced SiO2/SiC Defects," Journal of Electronic Materials; vol. 25, No. 5, 1996, pp. 909-915.

Chung et al, Effect of Nitric Oxide Annealing on the Interface Trap Densities Near the Band Edges in the 4H Polytype of Silicon Carbide; Applied Physics Letters, vol. 76, No. 13, Mar. 2000, pp. 1713-1715.

Li et al, Improving SiO2 Grown on P-Type 4H-SiC by NO Annealing, Materials Science Forum; vols. 264-268, 1998, pp. 869-872 Trans Tech Publications, Switzerland.

Lipkin et al, N2O Processing Improves the 4H-SiC:SiO2 Interface; Materials Science Forum, vols. 389-393, 2002, pp. 985-988, 2002 Trans Tech Publications, Switzerland.

Ohno et al, "Effect of surface passivation on breakdown of AlGaN/an HEMTs," Compound Semiconductors, 2003, International Symposium, Aug. 25-27, 2003, Piscataway, NJ, pp. 169-170.

Ganem et al, "NRA and XPS Characterizations of Layers Formed by Rapid Thermal Nitridation of Thin SI02 Films," Nuclear Instruments & Methods in Physics Research, Section-B: Beam Interactions With Materials and Atoms, Elsevier, Amsterdam, NL, vol. 1364, No. 1-4, 1992, pp. 744-749.

International Search Report and Written Opinion for International Application No. PCT/US2006/048817, mailed Jun. 25, 2007.

European Search Report for EP 08 16 3116 dated Jan. 15, 2010, 2 pages.

* cited by examiner

PASSIVATION OF WIDE BAND-GAP BASED SEMICONDUCTOR DEVICES WITH HYDROGEN-FREE SPUTTERED NITRIDES

RELATED APPLICATIONS

This is a continuation in part of Ser. No. 11/169,378 filed Jun. 29, 2005 now U.S. Pat. No. 7,525,122.

This invention was made with government funds under Contract No. 99-C-3761 awarded by the Department of the Navy; Contract No. 99-C-2914 awarded by the Air Force Research Laboratory; Contract No. 99-2-1472 awarded by the Air Force Research Laboratory; Contract No. 99-C-0173 awarded by the Office of Naval Research; and Contract No. 99-C-5316 awarded by the Air Force Research Laboratory. The U.S. Government may have rights in this invention.

BACKGROUND

The present invention relates to semiconductor structures and devices formed in wide bandgap materials such as the Group III nitrides.

The performance capabilities of semiconductor devices fundamentally depend upon the inherent properties of the semiconductor materials from which they are made, as well as the extent to which these materials can be incorporated in a useful device structure. Semiconductor devices also depend upon the manner in which various semiconductor materials are formed and arranged with respect to one another.

One of the characteristics of semiconductor materials is their bandgap; i.e., the energy difference between the valence band of electrons and the conductance band. The size of the material's bandgap provides fundamental limitations upon—or possibilities for—device structures and performances.

As one example, microwave systems—typical examples of which include cellular communications systems—commonly use solid state transistors as amplifiers and oscillators. As such systems expand in subscribers and desired (or required) capacity, interest in increasing their operating frequency and power has grown correspondingly. Higher frequency signals can carry more information (bandwidth), allow for smaller antennas with very high gain, and provide systems such as radar with improved resolution. Because a larger bandgap can accommodate wider bandwidth signals, wide bandgap materials such as silicon carbide (SiC) and the Group III (Ga, Al, In) nitrides have been, and continued to be, materials of significant interest for high frequency devices.

Higher bandgap materials also offer the potential for higher power capabilities (as compared to similar structures made from smaller bandgap materials) as well as the potential for emitting light at higher frequencies; e.g., the green, blue, violet and ultraviolet portions of the electromagnetic spectrum.

Devices fabricated from silicon carbide are typically passivated with an oxide layer, such as $SiO_2$, to protect the exposed SiC surfaces of the device, or for other reasons, or both. The interface between SiC and $SiO_2$, however, may be insufficient to obtain a high surface mobility of electrons. More specifically, the interface between SiC and $SiO_2$ conventionally exhibits a high density of interface states, which may reduce surface electron mobility and introduce carrier traps, which in turn reduces the desired performance characteristics of devices such as (but not limited to) metal-oxide-semiconductor field-effect transistors (MOSFETs).

Accordingly, in many circumstances semiconductor devices, including those that include oxidation layers, also incorporate one or more layers of silicon nitride to improve the resulting electronic properties (e.g., U.S. Pat. No. 6,246,076). Silicon nitride also provides an environmental barrier that the oxide fails to provide, or without which, would allow the environment to degrade the structure and operation of the device, regardless of whether the device includes an oxide layer. As an environmental barrier, silicon nitride is preferred over silicon dioxide because it forms a better seal over the device, preventing contaminants such as water from reaching the epitaxial layers of the device and from causing degradation. Silicon nitride may also be used to form layers that transmit light generated within an LED.

The dense structure of silicon nitride does not provide the open channels found in oxide structures; thus, nitride is widely employed in electronics as a barrier material. In particular, hydrogen diffuses slowly in a densified nitride film, and other small positive ions ($Na^+$ or $K^+$) are effectively blocked by thin nitride layers. Because oxygen diffuses very slowly through nitride, deposited nitride can prevent oxidation of underlying silicon.

Nevertheless, nitrides deposited using chemical vapor deposition (often plasma enhanced chemical vapor deposition, "PECVD") almost always contain hydrogen, typically much more than in the comparable oxide films. The source of the hydrogen is the silane ($SiH_4$) precursor and also the ammonia ($NH_3$) employed in many CVD schemes. An amorphous, but constrained, film such as silicon nitride can discourage the atoms from occupying positions that fill the valences of each silicon and nitrogen atom. Thus, many broken bonds tend to be present. These bonds are readily occupied by hydrogen atoms. As a result, conventional plasma nitrides can have as much as 20 atomic percent hydrogen, bonded both to the Si and N atoms, and; thermal nitrides still have several percent hydrogen even after high-temperature anneals.

Additionally, hydrogen can passivate Mg-acceptors in a GaN-based semiconductor. Although the precise mechanism is not completely understood, when silicon nitride is deposited by means of PECVD at a deposition temperature in excess of 200° C., hydrogen in the film can diffuse through thin ohmic contacts or other layers and into nearby Group III nitride layers, causing them to become passivated in a region close to their surface. That is, in a region near the surface, a substantial number of acceptor ions are rendered neutral by the introduction of hydrogen in the film. Accordingly, an interface between an ohmic contact and a nitride material is degraded, and the contact metal does not exhibit ideal ohmic characteristics. This can result in an increase in forward voltage ($V_f$ degradation) in the device. Essentially, the device will behave as though the interface between a metal and a Group III nitride contact layer forms a Schottky contact instead of an ohmic contact.

Because nitride passivation layers are often used in conjunction with oxide layers, the hydrogen can migrate to the oxide layers. In turn, hydrogen in oxide films on SiC has been shown to alter the interface Fermi level and encourage a state of surface accumulation. Any resulting accumulation layer produces a charge layer that alters the device capacitance and exhibits a drift with a long time constant caused by the mobility of the hydrogen in the film.

Accordingly, although oxide and nitride layers offer certain advantages, they also raise certain problems that can limit or degrade device performance.

SUMMARY

In one aspect the invention is an improved field effect transistor formed in the Group III nitride material system. The improvement includes a two part passivation structure in which a chemical vapor deposited passivation layer of silicon nitride encapsulates a previously sputtered-deposited layer of silicon nitride. The sputtered layer provides some of the benefits of passivation and the chemical vapor deposited layer provides an excellent environmental barrier.

In another aspect, the invention is a high electron mobility transistor (HEMT). In this aspect the invention includes a Group III heterostructure, a first passivation structure on the Group III nitride layer for reducing parasitic capacitance and minimizing device trapping, and a second passivation structure on the first passivation structure for encapsulating the structure and providing an environmental barrier. The first passivation structure includes at least one sputtered layer of non-stoichiometric nitride selected from the group consisting of silicon nitride, aluminum nitride, oxynitrides of silicon and oxynitrides of aluminum, and at least one chemical vapor deposited layer of silicon nitride for positioning the passivation layers further from said Group III nitride layer without fully encapsulating said structure. The second passivation structure includes an environmental barrier of stoichiometric nitrides.

In yet another aspect, the invention is an insulated gate field effect transistor that includes a Group III nitride heterostructure, respective source and drain ohmic contacts on the heterostructure, an insulating layer on the heterostructure between the source and drain ohmic contacts, a gate contact to the insulating layer on the heterostructure, and respective first and second passivation structures on the heterostructure and at least portions of the gate contact. The first passivation structure includes at least one sputtered layer of non-stoichiometric nitride selected from the group consisting of silicon nitride, aluminum nitride, oxynitrides of silicon and oxynitrides of aluminum, and at least one chemical vapor deposited layer of silicon nitride for positioning the passivation layers further from the Group III nitride heterostructure without fully encapsulating the transistor. The second passivation structure includes an environmental barrier of stoichiometric nitrides.

The foregoing and other objects and advantages of the invention and the manner in which the same are accomplished will become clearer based on the followed detailed description taken in conjunction with the accompanying drawings.

DETAILED DESCRIPTION

The invention is a passivated semiconductor structure and resulting passivated semiconductor devices. In one aspect, the invention can be broadly considered as a two part structure in which a chemical vapor deposited passivation layer of silicon nitride encapsulates a previously sputtered-deposited layer of silicon nitride. The sputtered layer provides some of the benefits of passivation and the chemical vapor deposited layer provides an excellent environmental barrier.

In another aspect, the invention is a two-part structure formed of a stoichiometric layer of silicon nitride deposited upon a non-stoichiometric layer of silicon nitride. The non-stoichiometric layer enhances the electronic properties of the structure or resulting device and the stoichiometric layer provides an excellent environmental barrier.

It will be understood that as used herein and as is common in the semiconductor art, past tense terms such as, "oxidized," "sputtered," and "chemical vapor deposited," are used as adjectives as well as verbs. Thus, they describe structures which are well understood in this art and the context of their use will be clear herein.

FIGS. 1 and 3-6 illustrate the invention in the context of respective exemplary devices. It will be understood that the invention is not limited to the illustrated devices or to particular families of devices, but can be incorporated as desired or needed in a wide variety of devices familiar to those of skill in this art.

Because the nature of the invention in is primarily, although not exclusively, emphasized in the passivation structure, the operation of the illustrated devices, which is otherwise well understood by those of ordinary skill in this art, will not be described in detail herein. Exemplary references for semiconductor devices include Dorf, *The Electrical Engineering Handbook*, Second Edition (CRC Press 1997), Chapter 39, particularly pages 994-996; and Sze, *Physics of Semiconductor Devices*, Second Edition (John Wiley & Sons, Inc. 1981).

It will likewise be understood that the materials for the ohmic and gate contacts can be selected from a plurality of metals or highly conductive semiconductors and that this can be accomplished without undue experimentation by those of skill in this art.

Figure 1:
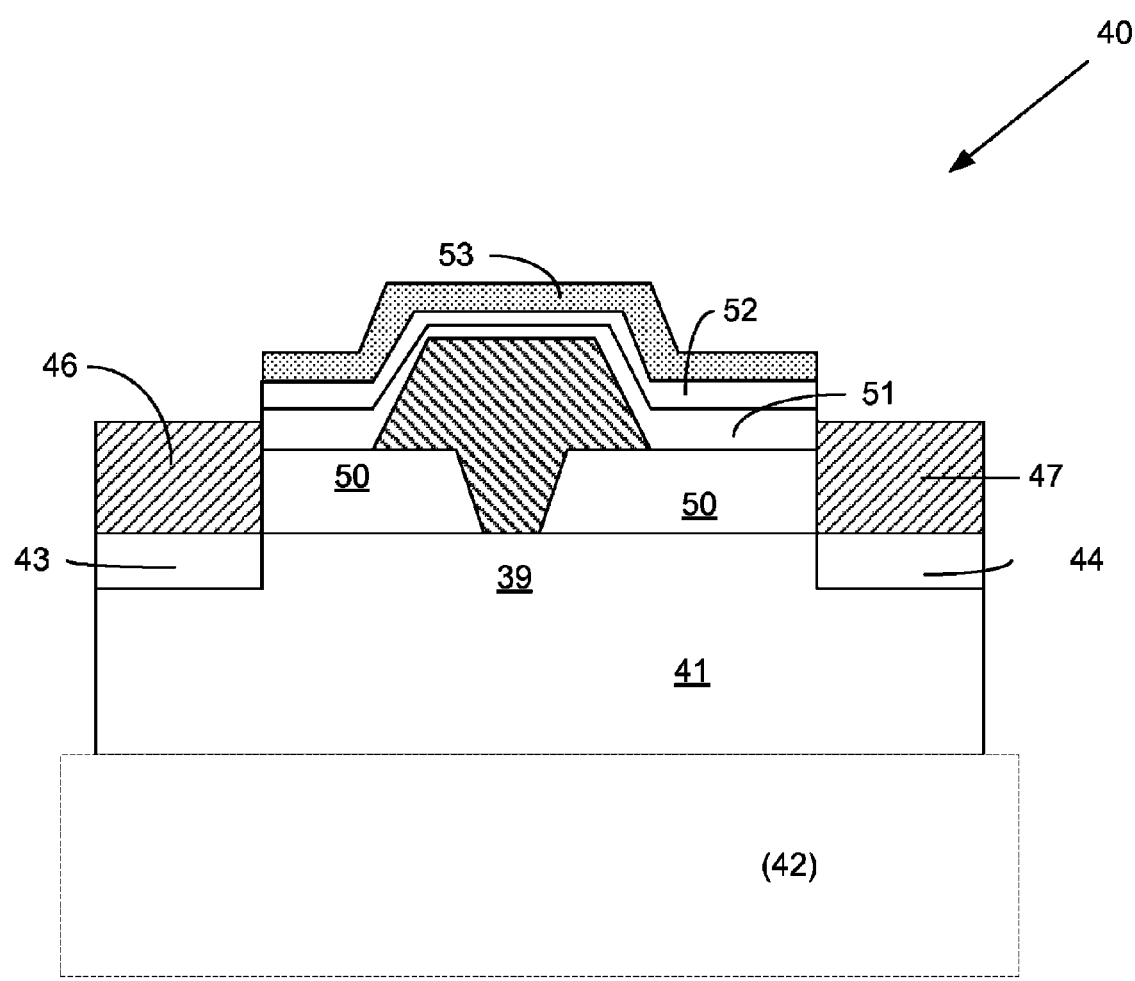
FIG. 1 is a schematic cross sectional view of a Group III nitride based device that incorporates the present invention.

FIG. 1 illustrates a metal-semiconductor field-effect transistor (MESFET) 40 based on gallium nitride (GaN) or aluminum gallium nitride (AlGaN) as the semiconductor. The device 40 includes a gallium nitride or aluminum gallium nitride layer 41 and potentially can include an additional substrate (or substrate and buffer structure) which is designated by the dotted rectangle 42. A bulk crystal of gallium nitride can theoretically eliminate the need for the substrate and buffer 42, but most devices of this type will include a substrate of SiC or sapphire or some other suitable material.

It will be further understood that the aluminum gallium nitride is best expressed as $Al_xGa_{1-x}N$ where $0<x<1$. The atomic fractions of aluminum and gallium can be selected as desired or necessary based upon the intended structure and operation of the device The device 40 includes the source region 43 and the drain region 44 with ohmic contacts 46 and 47 made to the source 43 and drain 44 respectively to define a channel 39 therebetween.

A first passivation structure formed of nonstoichiometric silicon nitride is on the Group III nitride layer 41. The first passivation structure reduces parasitic capacitance and minimizes device trapping and positions subsequent passivation layers further from the channel 39. In the illustrated embodiment, the first passivation structure comprises two layers 50 and 51 of sputtered non-stoichiometric silicon nitride on the Group III nitride layer 41. Layer 50 can also include low-hydrogen, high quality, stoichiometric silicon nitride or silicon dioxide.

In the illustrated embodiment the second passivation structure comprises a sputtered-deposited layer 52 of silicon nitride on the first passivation structure, and in particular on the layer 51, and a chemical vapor deposited layer 53 of silicon nitride on the sputter-deposited layer 52. In exemplary embodiments, both of the layers 52 and 53 comprise stoichiometric silicon nitride.

The sputtered layers 50 and 51 are advantageously substantially hydrogen free, and similarly because the layer 52 is also sputtered, it is likewise substantially hydrogen free and have a refractive index of between about 1.85 and 2.05.

The first sputtered nonstoichiometric layer 50 reduces parasitic capacitance and minimizing device trapping. The second sputtered non-stoichiometric silicon nitride layer 51 positions subsequent passivation layers further from the substrate 42, but without fully encapsulating the transistor 40. The sputtered stoichiometric silicon nitride layer 52 initially encapsulates the transistor 40 and enhances the hydrogen barrier properties of the passivation layers. The chemical vapor deposited environmental barrier layer 53 covers the transistor 40 to provide step coverage and crack prevention.

The first two sputtered layers 50 and 51 are preferentially nitrogen-rich. As well understood in this art, the proportion of silicon or nitrogen (in a non-stoichiometric composition) can be determined by the refractive index, which is an indicator of the composition of the formed silicon nitride film. A silicon nitride film having a substantially stoichiometric composition has a refractive index of 2.02 measured @ 6328 Å.

Silicon rich nitride has an atomic ratio of silicon to nitrogen that is greater than 3:4 (i.e., stoichiometric silicon nitride is $Si_3N4$). A typical silicon rich nitride will have an index of refraction of greater than 2.02 measured @6328 Å and a nitrogen rich SiN film will have an index of refraction lower than 2.02 measured @6328 Å.

Accordingly, in exemplary embodiments each of the non-stoichiometric sputtered silicon nitride layers have a refractive index of between about 1.85 and 1.95.

One purpose of sputtering is to avoid the presence of hydrogen as described elsewhere herein, and to correspondingly avoid the electronic problems associated with the presence of hydrogen. Accordingly, the sputtered layers can also be understood as hydrogen-free layers. Stated differently, sputtering is one technique for producing a hydrogen-free passivation layer. The invention, however, can also be understood as the hydrogen free passivation layer regardless of its method of manufacture.

Figure 2:
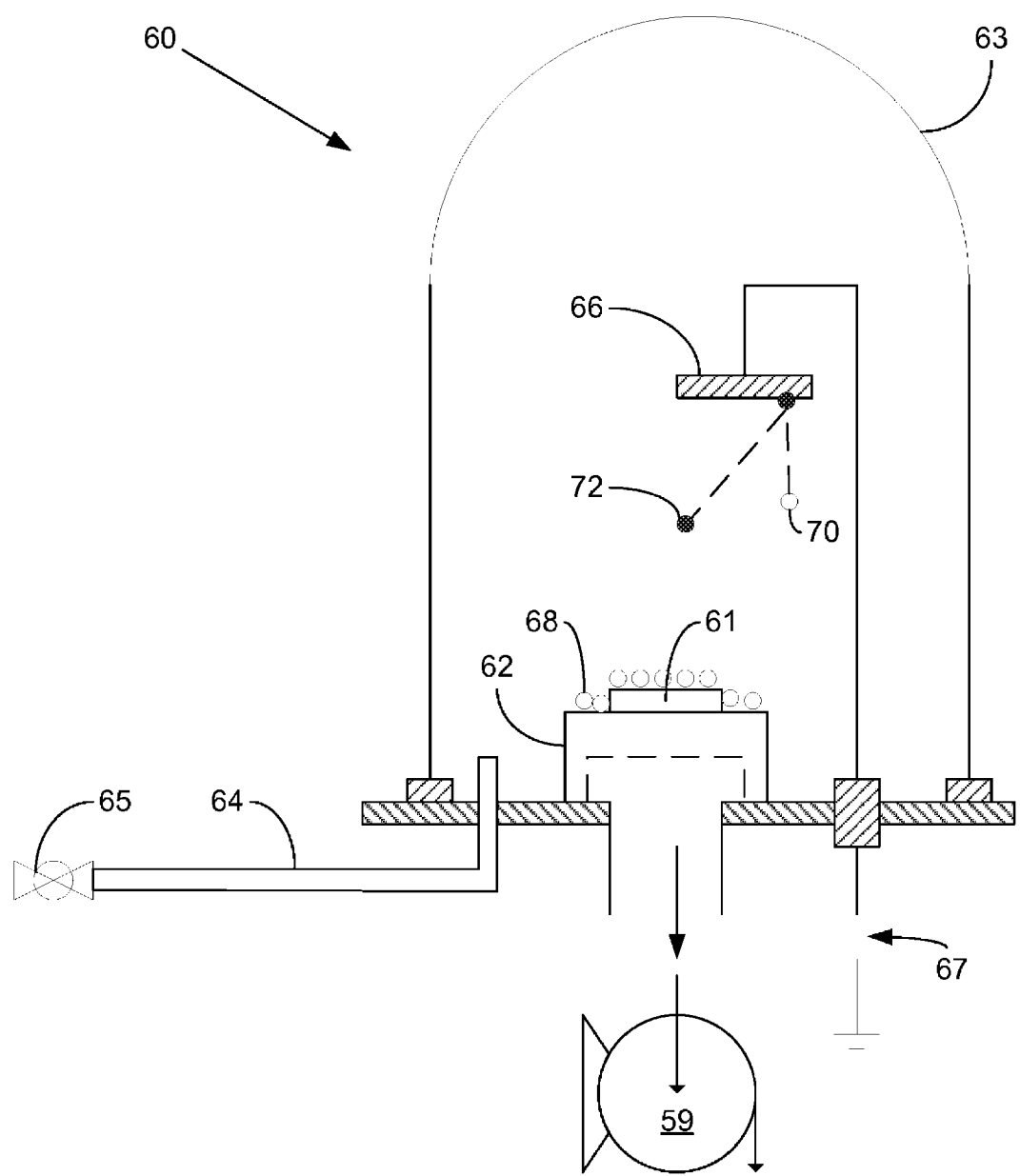
FIG. 2 is a schematic view of a sputtering system used in conjunction with the present invention.

FIG. 2 is a schematic diagram of a sputtering system 60 similar to the one set forth in U.S. Pat. No. 6,586,781. The substrate upon which the sputter layer is intended is indicated at 61 on an electrode (anode) 62 in a chamber 63. The pressure in the chamber 63 is typically reduced using a vacuum pump 59 and the desired gas or gases (typically inert or noble gases such as argon) are added to the chamber 63 through the passage 64 and controlled by the valve 65. When a sufficient voltage is applied between the electrodes (as schematically indicated at 67), gas molecules become ionized and accelerate to impinge upon (in this case) the silicon target 66 which also serves as the cathode. The impinging gas ion will eject silicon ions or atoms 72 which then deposit on the substrate 61 as indicated by the small circles 68.

The nature and operation of sputtering devices is well understood in this art and thus will not be described in further detail. Similarly, appropriate sputtering instruments can be obtained commercially and can be operated by persons of skill in this art without undue experimentation.

Figure 3:
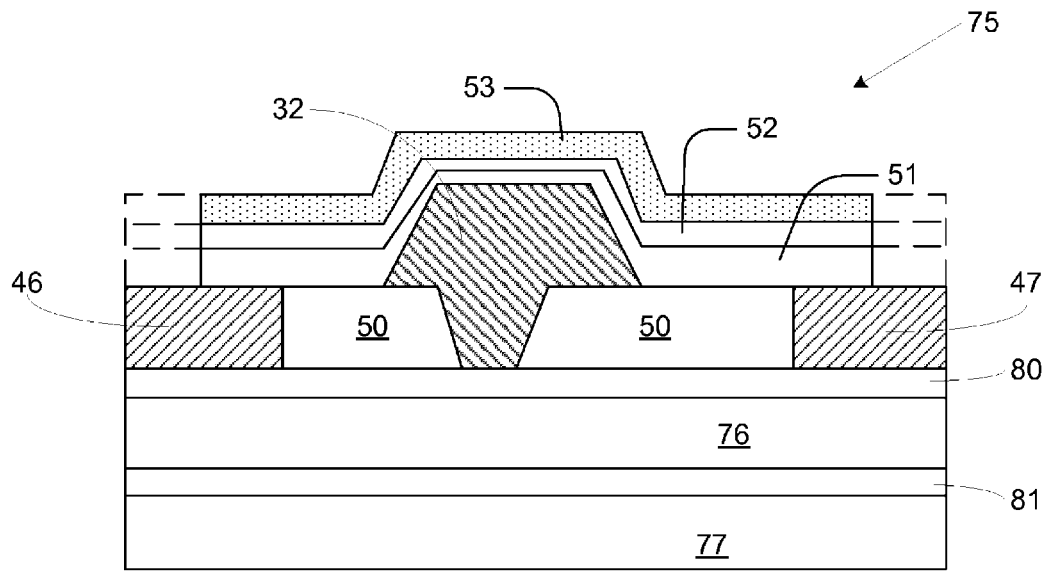
FIG. 3 is across sectional schematic view of another Group III nitride based high electron mobility transistor that incorporates the invention.

FIG. 3 is another embodiment of Group III nitride-based HEMT according to the invention. The transistor is broadly designated at 75 and where the same elements are illustrated as in FIG. 1, they will carry the same reference numerals.

Figure 6:
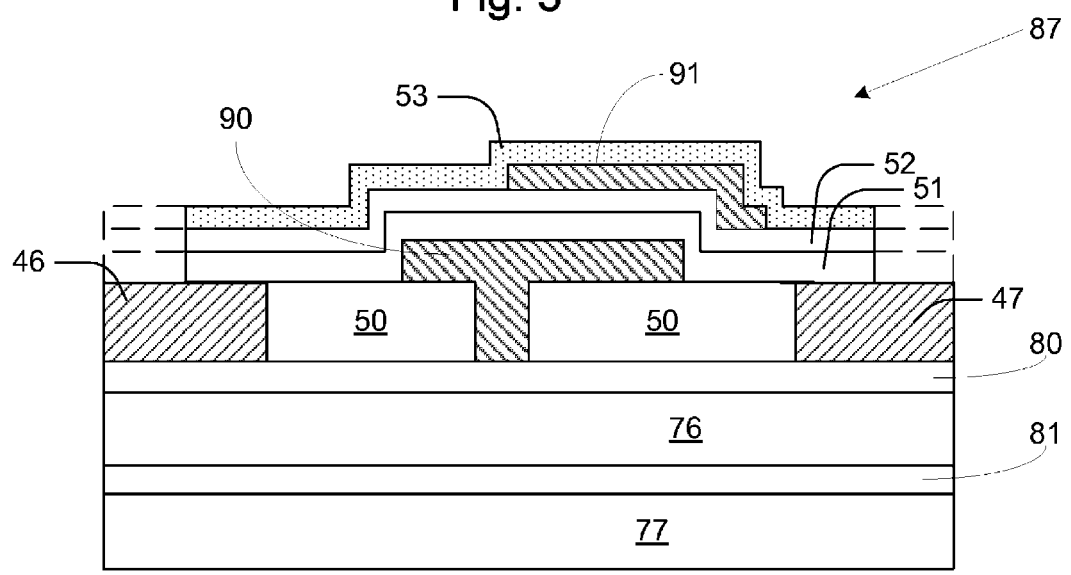
FIG. 6 is an embodiment of a Group III nitride high electron mobility transistor with a field plate that incorporates the passivation system of the invention.

FIG. 6 illustrates that a HEMT according to the invention can be formed on respective (barrier) layer 76 and (channel) layer 77 of Group III nitride. In order to form the two dimensional electron gas, the adjacent layers 76 and 77 have different compositions and thus produce the hetero structure for the transistor. For practical purposes, these layers are typically positioned on a substrate such as 42 (FIG. 1) which, as noted earlier, is frequently silicon carbide.

FIG. 3 also illustrates two additional Group III nitride spacer layers 80 and 81 that, when present, can enhance the response of the transistor. As known to those familiar with Group III nitride heterostructures, the low field mobility of the transistor can be limited by the presence of doping impurities and lattice vibrations which can adversely affect the movement of the electrons in the device channel. Physically separating the impurities from the channel with thin layers such as 80 and 81 can address this issue and enhance the transistor's performance.

In an exemplary embodiment, the layer 76 is formed of aluminum gallium nitride and the layers 77 is formed of gallium nitride to produce the heterostructure for the transistor 75. In an exemplary embodiment that includes the layers 80 and 81, the layer 80 is formed of gallium nitride and the layer 81 is formed of aluminum nitride.

As with respect to FIG. 1, the transistor 75 can include the first sputtered silicon nitride or aluminum nitride layer 50 and the second sputtered silicon nitride layer 51, both of which may be non-stoichiometric, hydrogen free, and have the desired refractive index of between about 1.85 and 2.05. The encapsulating stoichiometric silicon nitride layer is again illustrated at 52 and the stoichiometric plasma enhanced chemically vapor deposited layer is again illustrated at 53.

In this embodiment, the layer 50 can be formed from one of several different passivation materials. These can include high-quality stoichiometric silicon nitride ($Si_3N_4$) deposited in a manner that yields low hydrogen content, low oxygen content and very low to zero buffered oxide etch (BOE), high quality stoichiometric silicon nitride with a covering layer of silicon dioxide, a stack of sputtered silicon nitride and plasma enhanced chemical vapor deposited silicon nitride; metal organic chemical vapor deposited (MOCVD) silicon nitride, or plasma enhanced chemical vapor deposition (PECVD) silicon nitride, most preferably using a high density plasma chemical vapor deposition system where molecular nitrogen ($N_2$) can be used as the nitrogen source instead of ammonia ($NH_3$) to advantageously minimize or eliminate the presence of hydrogen in the.

In the embodiment illustrated in FIG. 3, the passivation layer 51 is typically the sputtered silicon nitride while the passivation layer 52 can include the high quality stoichiometric silicon nitride, the plasma enhanced chemically vapor deposited silicon nitride, or plasma enhanced chemical vapor deposited oxynitride.

The final layer 53 can include the high-quality stoichiometric silicon nitride, the plasma enhanced chemical vapor deposited silicon nitride, or the plasma enhanced chemical vapor deposited oxynitride.

If desired or necessary, the transistor illustrated in FIG. 3 can include a field plate (not shown) in a manner analogous to the structure illustrated in FIG. 6 herein.

Figure 4:
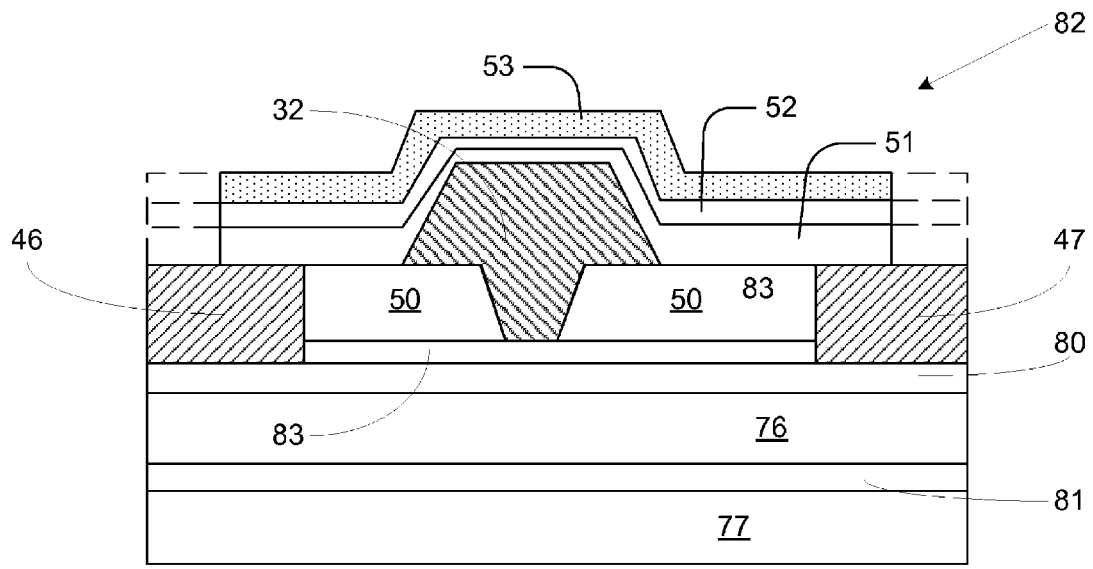
FIG. 4 is another embodiment of the Group III nitride high electron mobility transistor that incorporates the invention.

FIG. 4 illustrates an insulated gate transistor that incorporates the present invention. The respective passivation structure illustrated by the layers 50, 51, 52 and 53 is the same as described with respect to the earlier figures. FIG. 4 illustrates a transistor broadly designated at 82 that also includes an insulating layer 83 between the gate contact 32 and the heterostructure formed by the layers 76 and 77 (and potentially the layers 80 and 81).

Figure 5:
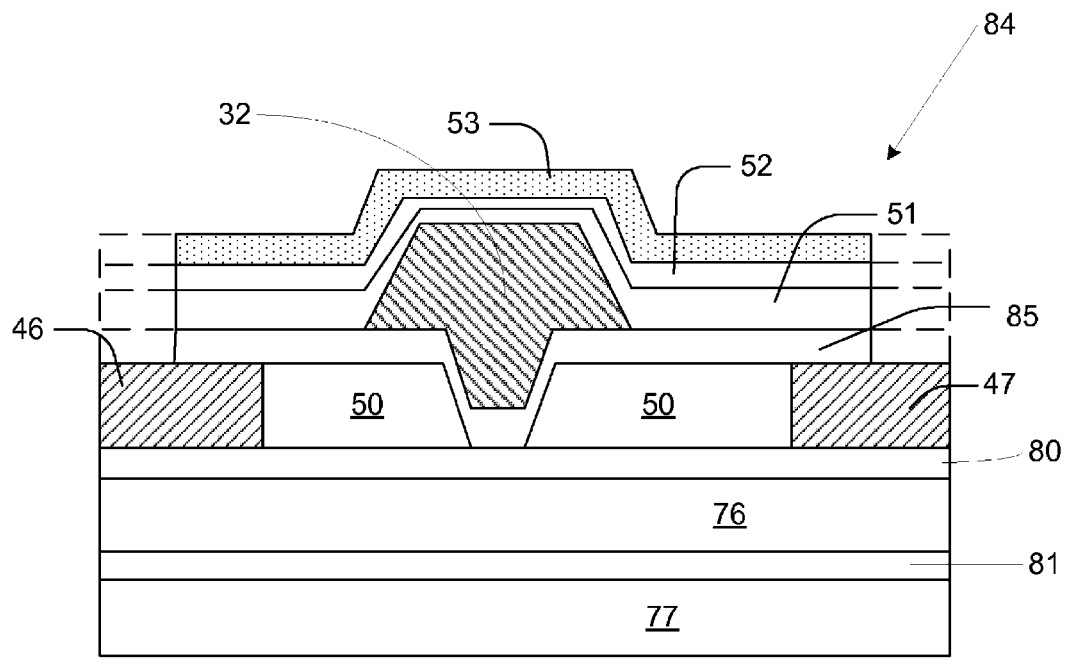
FIG. 5 is yet another embodiment of a Group III nitride high electron mobility transistor that incorporates the passivation system of the invention.

FIG. 5 illustrates another insulated gate transistor that incorporates the passivation structure of the invention broadly designated at 84. In this embodiment, the insulating layer 85 has portions that are again positioned between the gate contact 32 and the heterostructure formed by the Group III nitride layers 76, 77, 80, and 81. The insulating layer 85 also, however, has portions that extend above and over the first sputtered silicon nitride layer 50 but covered entirely by the second sputtered silicon nitride layer 51.

FIG. 6 illustrates a high electron mobility transistor according to the invention that further includes a field plate 91. As with respect to the other drawings, elements that are, or can be, the same as in the other embodiments carry the same reference numerals. Thus, FIG. 6 broadly illustrates the transistor at 87 and illustrates that it includes all of the elements of FIG. 3

In the embodiment illustrated in FIG. 6, the field plate 91 is positioned to overlap the gate contact 90. This overlapping structure eliminates the need to fabricate a device with a carefully monitored lateral separation between the gate and the field plate. As a balancing consideration, the overlapping relationship between the field plate 91 and the gate 90 can introduce unwanted additional capacitance. Accordingly, in other embodiments (not illustrated) the field plate 91 does not overlap the gate 90, but in such circumstances, the lateral relationship between the gate contact 90 and the field plate 91 must be carefully controlled in order to make sure that the field plate 91 is isolated from the gate 90 while still maximizing the field effect provided by the field plate 91. In the embodiment illustrated in FIG. 6, the field plate 91 is spaced from the gate 90 by layers 51 and 52, but in turn is covered by layer 53.

These factors along with other uses and advantages of a field plate are described, for example, in commonly assigned and co-pending United States Patent Application Publication No. 20060006415, the contents of which are incorporated entirely herein by reference. The use of the field plate 91 can reduce the electric field in the device, in turn resulting in an increased breakdown voltage and reduced trapping. Reducing the electric field with the field plate can also reduce leakage current and enhance the transistor's reliability. The field plate 91 is typically connected to the source electrode 46 which reduces gain and instability, and the shielding effect can enhance input-output isolation.

Method

In another aspect, the invention is a method of passivating Group III nitride based structures and devices. In this aspect, the invention is a method comprising sputter-depositing a non-stoichiometric silicon nitride layer, and depositing an environmental barrier of stoichiometric silicon nitride ($Si_3N_4$) by chemical vapor deposition, and in exemplary cases, by plasma enhanced chemical vapor deposition. Exemplary annealing techniques are set forth in U.S. Pat. No. 6,610,366, in Lipkin, $N_2O$ Processing Improves the 4H—SiC: $SiO_2$ Interface; MATERIALS SCIENCE FORUM, Volumes 389-393 (2002) pages 985-88; and in Dmitrijev, Improving $SiO_2$ Grown on P-type 4H—SiC by NO Annealing, MATERIALS SCIENCE FORUM, Volumes 264-268 (1998) pages 869-72.

As set forth in the experimental section, in exemplary embodiments the sputtering is carried out using a silicon target in a substantially hydrogen-free environment, which can incorporate argon (Ar) and nitrogen ($N_2$). The method can include sputtering with a pulsed direct current (DC) power source to thereby discharge insulating particles while avoiding arcing.

The sputtering can be carried out at room temperature, or at an elevated substrate temperature. If the sputtering is carried out at an elevated substrate temperature, it should be carried out in a manner that avoids exceeding temperatures that would otherwise detrimentally affect the remainder of the device. The substrate temperature can be raised to between about 350° C. and 450° C. without detrimental effects. The substrate temperature and the gas pressure are typically interrelated and thus are controlled accordingly.

The method can comprise sputtering in a nitrogen-rich environment to provide a nonstoichiometric silicon nitride. The environmental barrier, however, is typically formed of a stoichiometric silicon nitride layer because of its better barrier properties as compared to the nonstoichiometric silicon nitride layer.

The ion bombardment can be enhanced by applying a radio frequency biased to the substrate, or by lowering the ambient pressure during the sputtering step.

The method can be carried out in substantially the same manner for Group III nitride based devices, with the exception that a thermal oxide is not included and the silicon nitride is sputtered directly on the Group III nitride device or structure.

Experimental

On GaN devices, the first passivation is deposited after T gates are formed. The first passivation for GaN devices consists of two layers. A sputtered SiN or AlN is deposited on top surface of the GaN (typically AlGaN). This is followed by a PECVD SiN film.

The salient feature is again, to move a typical hydrogen contaminated PECVD nitride film away from the device interface and replace it with a sputtered nitride film (SiN or AlN). This film can also be an oxynitride of Si or Al. A PECVD SiN film is deposited on top of the sputtered passivation layer. The PECVD film offers good step coverage under the gates, when necessary.

The second passivation of the GaN devices can use sputtered nitrides or PECVD nitrides or the combination of both.

The second passivation is added after gates and T top are formed. The second passivation consists of three dielectric layers. The first two dielectric layers are sputtered SiN. The first sputtered SiN layer of 100 to 3000 Å is a nitrogen rich film ($N_2$ flow of 14 to 18 sccm and process pressure of 7 to 10 mT) with refractive index in the range of 1.85 to 2.00. This film moves the subsequent passivation layers away from the device interface, but does not yet encapsulate. The second sputtered SiN layer with thickness of 1000 to 3000 Å is a stoichiometric nitride with refractive index of 2.04 measured at 630 nm. This film is deposited at lower nitrogen flow and higher bombardment ($N_2$ flow of 12 to 14 sccm and process pressure of 1 to 3 mT). The encapsulating properties of this film are improved by ion bombardment, either through lower pressure, or using RF bias on the wafers (about 0.5 W/inch$^2$). The sputtered SiN film provides good encapsulation, and also moves the third dielectric layer further away from the device interface.

The second sputtered SiN layer, however, may not offer adequate step coverage. This is addressed in the third dielectric layer. A 2000 to 5000 Å PECVD SiN layer is deposited on top of the sputtered SiN layers using $SiH_4$ 2%, 350 sccm; $NH_3$, 4 sccm; $N_2$, 200 sccm; He, 90 sccm; pressure, 1 Torr; power, 25 W. The critical process parameter in the PECVD SiN deposition is substrate temperature; higher substrate temperatures tend to drive hydrogen out of the film. The substrate temperature is kept as high as other existing films on the wafer allow, typically between about 250° C. to 450° C. The stoichiometric sputtered SiN film offers a barrier to the hydrogen present during PECVD deposition. The PECVD offers a final environmental encapsulant with excellent step coverage.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. In a field effect transistor formed in the Group III nitride material system, the improvement in passivation comprising: a two part structure in which a chemical vapor deposited passivation layer of silicon nitride encapsulates a previously sputtered-deposited layer of silicon nitride; said sputtered layer providing some of the benefits of passivation and said chemical vapor deposited layer providing an excellent environmental barrier.

2. A high electron mobility transistor (HEMT) comprising: a Group III heterostructure;
a first passivation structure on said Group III nitride heterostructure for reducing parasitic capacitance and minimizing device trapping; and
a second passivation structure on said first passivation structure for encapsulating said heterostructure and providing an environmental barrier;
said first passivation structure comprising at least one sputtered layer of non-stoichiometric nitride selected from the group consisting of silicon nitride, aluminum nitride, oxynitrides of silicon and oxynitrides of aluminum, and at least one chemical vapor deposited layer of silicon nitride for positioning said passivation layers further from said Group III nitride layer without fully encapsulating said heterostructure; and
said second passivation structure comprising an environmental barrier of stoichiometric nitrides.

3. A HEMT according to claim 2 wherein said heterostructure comprises a layer of aluminum gallium nitride and a layer of gallium nitride.

4. A HEMT according to claim 3 further comprising a first spacer layer of Group III nitride between said aluminum gallium nitride layer and said gallium nitride layer.

5. A HEMT according to claim 4 wherein said first spacer layer comprises aluminum nitride.

6. A HEMT according to claim 2 further comprising a gate contact to said Group III nitride heterostructure.

7. A HEMT according to claim 6 further comprising a second Group III nitride spacer layer between said gate contact and said heterostructure.

8. A HEMT according to claim 7 wherein said second spacer layer comprises gallium nitride.

9. A HEMT according to claim 6 further comprising respective source and drain ohmic contacts to said Group III nitride heterostructure and defining a channel therebetween.

10. A HEMT according to claim 6 wherein said heterostructure comprises a layer of aluminum gallium nitride on a layer of gallium nitride with said gate contact and said ohmic contacts on said aluminum gallium nitride layer.

11. A HEMT according to claim 2 further comprising a field plate separated from said gate contact by portions of said passivation structure.

12. A HEMT according to claim 2 wherein said second passivation structure comprises a sputtered stoichiometric layer of silicon nitride and a chemical vapor deposited stoichiometric layer of silicon nitride.

13. A HEMT according to claim 12 further comprising a field plate separated from said gate contact by said sputtered stoichiometric layer of silicon nitride and covered by said chemical vapor deposited stoichiometric layer of silicon nitride.

14. A HEMT according to claim 12 wherein said stoichiometric layer in said second passivation structure is substantially hydrogen free.

15. A HEMT according to claim 2 wherein said first passivation structure is substantially hydrogen free.

16. A HEMT according to claim 2 wherein said first passivation structure has a refractive index of between about 1.85 and 2.00.

17. A HEMT according to claim 2 wherein:
said sputtered layer of non-stoichiometric silicon nitride in said first passivation structure is between about 100 and 2000 angstroms thick;
said chemical vapor deposited layer of silicon nitride in said the first passivation structure is between about 100 and 3000 angstroms thick; and
said second passivation structure is between about 3000 and 8000 angstroms thick.

18. An insulated gate field effect transistor comprising:
a Group III nitride heterostructure;
respective source and drain ohmic contacts on said heterostructure;
an insulating layer on said heterostructure between said source and drain ohmic contacts;
a gate contact to said insulating layer on said heterostructure; and
respective first and second passivation structures on said heterostructure and ad least portions of said gate contact;
said first passivation structure comprising at least one sputtered layer of non-stoichiometric nitride selected from the group consisting of silicon nitride, aluminum nitride, oxynitrides of silicon and oxynitrides of aluminum, and at least one chemical vapor deposited layer of silicon nitride for positioning said passivation layers further from said Group III nitride layer without fully encapsulating said heterostructure; and
said second passivation structure comprising an environmental barrier of stoichiometric nitrides.

19. A transistor according to claim 18 wherein said second passivation structure comprises two layers of stoichiometric silicon nitride.

20. A transistor according to claim 18 wherein said insulating layer underneath said gate contact is underneath said first passivation structure.

21. A transistor according to claim 20 wherein said gate contact separates portions of said first sputtered layer of non-stoichiometric silicon nitride from one another.

22. A transistor according to claim 18 wherein said insulating layer covers portions of said sputtered layer of non-stoichiometric nitride in said first passivation structure.

23. A transistor according to claim 18 wherein said Group III nitride heterostructure comprises a layer of aluminum gallium nitride on a layer of gallium nitride with said gate insulating layer on said layer of aluminum gallium nitride.

24. A transistor according to claim 23 further comprising a first spacer layer between said gate insulating layer and said aluminum gallium nitride layer.

25. A transistor according to claim 24 wherein said first spacer layer comprises gallium nitride.

26. A transistor according to claim 23 further comprising a second spacer layer between said aluminum gallium nitride layer and said gallium nitride layer.

27. A transistor according to claim 26 wherein said second spacer layer comprises aluminum nitride.

28. A transistor according to claim 18 wherein said second passivation structure is substantially hydrogen free.

29. A transistor according to claim 18 wherein said first passivation structure is substantially hydrogen free.

30. A transistor according to claim 18 wherein said first passivation structure has a refractive index of between about 1.85 and 1.95.

31. A transistor according to claim 18 wherein:
said sputtered layer of non-stoichiometric silicon nitride in said first passivation structure is between about 1000 and 2000 angstroms thick;
said chemical vapor deposited layer of silicon nitride in said first passivation structure is between about 1000 and 3000 angstroms thick; and
said second passivation structure is between about 3000 and 8000 angstroms thick.

* * * * *